(12) United States Patent
Stauss et al.

(10) Patent No.: US 6,511,543 B1
(45) Date of Patent: Jan. 28, 2003

(54) HOLDING DEVICE

(75) Inventors: Peter Stauss, Feldkirch (AT); Jörg Kerschbaumer, Feldkirch (AT)

(73) Assignee: Unaxis Balzers Aktiengesellschaft, Balzers (LI)

( * ) Notice: Subject to any disclaimer, the term of this patent is extended or adjusted under 35 U.S.C. 154(b) by 0 days.

(21) Appl. No.: 09/581,857

(22) PCT Filed: Dec. 1, 1998

(86) PCT No.: PCT/CH98/00505
§ 371 (c)(1),
(2), (4) Date: Aug. 24, 2000

(87) PCT Pub. No.: WO99/34414
PCT Pub. Date: Jul. 8, 1999

(30) Foreign Application Priority Data

Dec. 23, 1997 (CH) .............................................. 2951/97

(51) Int. Cl.[7] .......................... B05C 13/00; B05C 13/02; B05C 21/00; B23Q 3/00
(52) U.S. Cl. ........................ 118/503; 118/500; 269/287

(58) Field of Search ...................... 204/298.15; 118/500, 118/503; 156/345, 345.54; 269/287

(56) References Cited

U.S. PATENT DOCUMENTS 5,094,885 A * 3/1992 Selbrede .................. 427/248.1
5,352,294 A * 10/1994 White et al. ................. 118/725
5,860,640 A * 1/1999 Marohl et al. .......... 269/289 R

* cited by examiner

*Primary Examiner*—Steven H. VerSteeg
(74) *Attorney, Agent, or Firm*—Notaro & Michalos P.C.

(57) ABSTRACT

A holding device for a vacuum unit has a lifting table transferable between a lower end position and an upper end position for moving a support plate toward the underside of a disc-shaped workpiece. The workpiece is supported by a support ring carrying centring pins spaced to form an equilateral triangle, in the center of which the axis of the support plate is located. A clamping ring clamps the workpiece with the support ring. The centring pins engage the clamping ring to center the support ring and clamping ring relative to the support plate axis so they are not affected by thermal expansion.

22 Claims, 2 Drawing Sheets

HOLDING DEVICE

FIELD AND BACKGROUND OF THE INVENTION

The invention relates to a holding device as used in vacuum units. It is used, for example in an intermediate chamber after transfer of a disc-shaped workpiece from a transport mechanism in a transfer position in which a lifting table thereof is, for example, in a lower end position, for lifting said workpiece into a processing position by virtue of the fact that the lifting table performs a lifting movement to an upper end position. In the processing position, the top of the workpiece is present in a process chamber and can be subjected to a processing step. After processing is complete, the lifting table lowers the workpiece again to the transfer position, where it can once again be picked up by the transport mechanism. A corresponding vacuum unit is described in EP-A-0 343 530.

In the case of holding devices of this type, it is desired that the support ring on which the workpiece is placed in the transport position is centred as accurately as possible relative to the support plate on which said workpiece rests in the processing position and by means of which it is heated or cooled. Consequently, the recesses at the edge of the support plate, which are necessary for supporting the support ring, can be kept small, and the processing of the workpiece, such as coating, heating or cooling or any other action of the support plate on the workpiece, takes place in a uniform manner.

A known holding device of the generic type is described in EP-A-0 452 779. There, the support ring is in the form of a ring directly surrounding the support plate. Since a specific radial distance must be provided between the two because of any different thermal expansions, exact centring of the support ring with respect to the axis of the support plate is not provided for in this design. Since the clamping ring is centred with respect to the support ring, it too is inevitably inaccurately centred with respect to the support plate.

SUMMARY OF THE INVENTION

The invention is intended to provide a remedy here. The invention, as characterized in the Claims, provides a holding device in which support plate, support ring and clamping ring are centred with respect to a common axis through a common centring device which engages all of said parts and whose function is not impaired by different thermal expansions of said parts, and which does not hinder necessary mutual axial displacements thereof.

A fundamental principle of operation of the proposed corresponding centring insensitive to thermal expansion is described for holding a lens in RU-C-2 047 197, where radial lamellae anchored to a housing engage corresponding radial grooves in the lens mount. In the case of this holder, however, no mutual axial displacement of the parts is envisaged.

The advantages achieved by the invention are in particular that concentric positioning of the disc-shaped workpiece on the support plate can be ensured and, owing to the accurate centring of the clamping ring with respect to the support plate and hence of the workpiece, the edge waste is very small. The holding device is particularly suitable for workpieces such as storage discs, for example hard discs, magnetooptical storage discs, CDs and especially semiconductor wafers.

BRIEF DESCRIPTION OF THE DRAWINGS

The invention is explained in more detail below with reference to Figures which show only an exemplary embodiment.

DESCRIPTION OF THE PREFERRED EMBODIMENT

Figure 1:
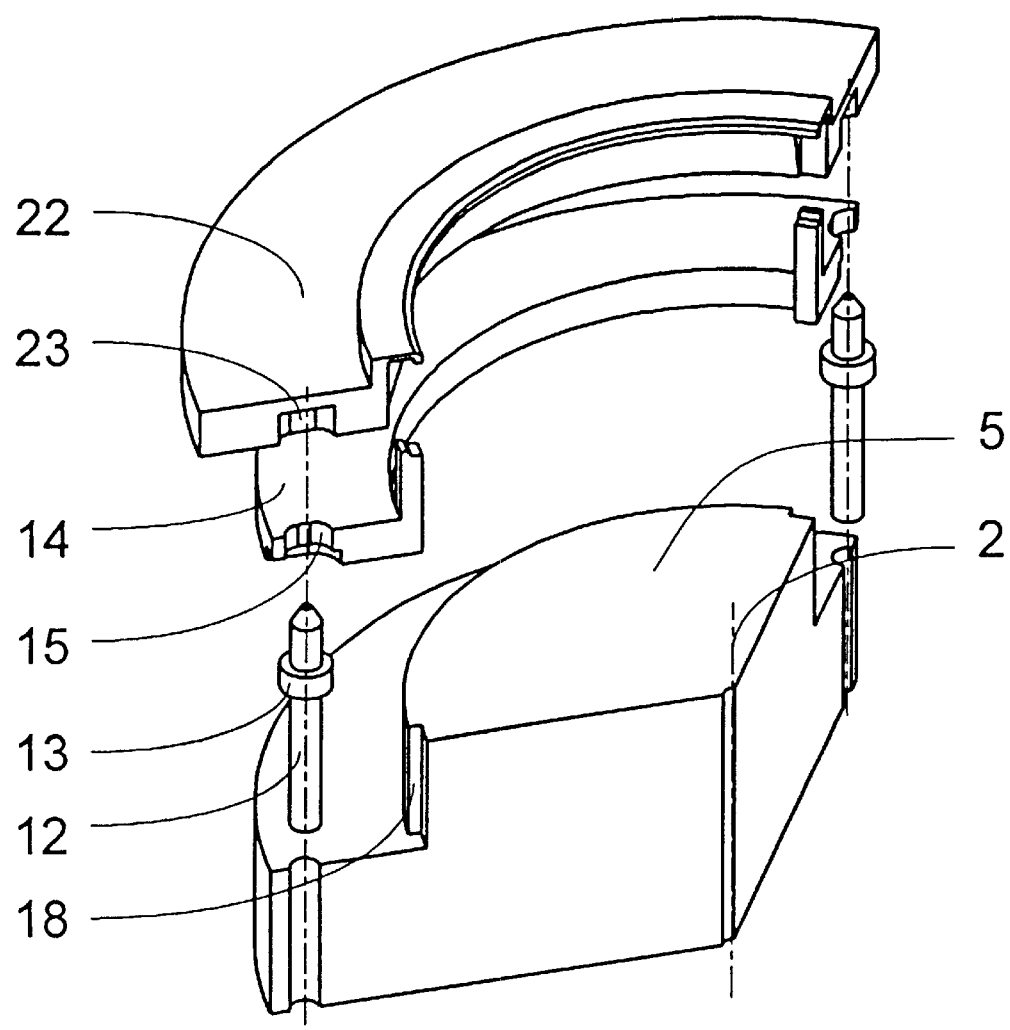
FIG. 1 shows a perspective exploded diagram of a cut-out sector of the holding device according to the invention and FIG. 2 shows, on the right, a first radial section through a holding device according to the invention, in a lower end position in which the workpiece can be transferred and, on the left, a corresponding second radial section through the same holding device according to the invention, in the upper end position in which the workpiece can be processed.

The holding device comprises (cf. especially FIG. 2, right) a lifting table 1 which is formed to be essentially rotationally symmetrical about an axis 2 and has a double support tube 3 which can be raised and lowered parallel to the axis 2 by a corresponding device not shown and whose inner tube 3a carries a baseplate 4 on which a support plate 5 is fastened, while the outer tube 3b carries a ring 6 having a driver collar 7 on its outer edge, which ring surrounds the baseplate 4 concentrically a distance away. The underside of the ring 6 is connected gas-tight, by means of a metal bellows 8 surrounding the double support tube 3, to the edge of an opening in a fixed wall 9 through which said double support tube is passed. Depending on the vacuum chamber for which the device is intended, the support plate 5 is heatable or coolable or both. Its shape depends on that of the workpiece to be processed. Usually, it will be round as shown, but other shapes are also possible; thus, for example, it may be rectangular. A pipe 10 through which gas can be passed in opens in its centre.

Centring pins 12, preferably comprising nonconducting, in particular ceramic material, are supported on the wall 9, i.e. in a fixed location, in the lower end position by means of three supports 11 whose positions form an equilateral triangle, in the centre of which is the axis 2. The support 11 is in each case passed through a hole in the ring 6 and projects into a hole in the baseplate 4 which hole is located above and is provided with a guide bush (not shown), the internal diameter of the hole being substantially greater than the diameter of the support 11 at the corresponding height. On the other hand, the centring pin 12 supported on the support 11 has a greater diameter corresponding approximately to the internal diameter of the last-mentioned hole or, more precisely, of the guide bush, so that it is guided axially displaceably therein but otherwise essentially without play. Fastened at slightly more than half height on the centring pin 12 is a stop ring 13 which surrounds said centring pin and whose underside forms a stop limiting the axial displaceability of the centring pin 12 relative to the baseplate 4.

A support ring 14 rests on the tops of the stop rings 13 and is provided there in each case with a groove which is radial, i.e. directed towards the centre of the ring, and which partly holds the stop ring 13 whose thickness is slightly greater than the depth of the groove while the width of the latter is greater than its diameter. However, it continues upwards in a radially oriented slot 15 through which the centring pin 12 is passed azimuthally essentially without play, so that the support ring 14 is fixed by the three centring pins 12 essentially nonrotatably and, transversely to the axis 2, nondisplaceably. On the other hand, limited radial movement is possible in each case between the individual centring pin 12 and support ring 14.

The support ring 14, which surrounds the support plate 5 at a slight distance, has, in the azimuthal positions of the centring pins 12, on its inner edge, three supports 16 which point upward and are provided with recesses in the insides for securely holding a workpiece 17, which may be, for example, a wafer. The supports 16 lie in corresponding grooves 18 (FIG. 1) which are let into the outer edge of the support plate 5. However, the supports 16 are also a slight radial distance away therefrom. The surface of the support plate 5 is only very slightly reduced in size by the grooves 18. It is also possible to provide more or differently arranged supports or a single support which surrounds the support plate continuously or in segments, for example in the form of a horseshoe.

Vertical pins 19 on which an intermediate ring 20 is supported are fastened to the wall 9 outside the centring pins 12 but in the same azimuthal positions. Said intermediate ring has, in the underside, grooves 21 which receive the tips of the vertical pins 19. The intermediate ring 20 has an approximately L-shaped cross-section with an inward-pointing flange which, in its rest position, supports a clamping ring 22 which projects inwards substantially beyond the intermediate ring 20 and likewise has there, in the underside, radial grooves 23 which are suitable for receiving the upper end regions of the centring pins 12, and likewise do so in such a way that in each case radial movement is possible but transversely thereto, azimuthally, the end regions engage the grooves 23 essentially without play. On the inside, the clamping ring 22 has an inner flange 24 which is offset slightly upwards and, with its edge bent slightly downwards and following the shape of the workpiece, for example of a circular shape as shown, overlaps the supports 16. Instead of a closed edge, however, the inner flange may also have individual fingers. On its outer ring surrounding the flange, the intermediate ring 20 has a protective profile 25 whose inward-pointing flange covers the top of the clamping ring 22, with the exception of the inner flange 24.

Figure 2:
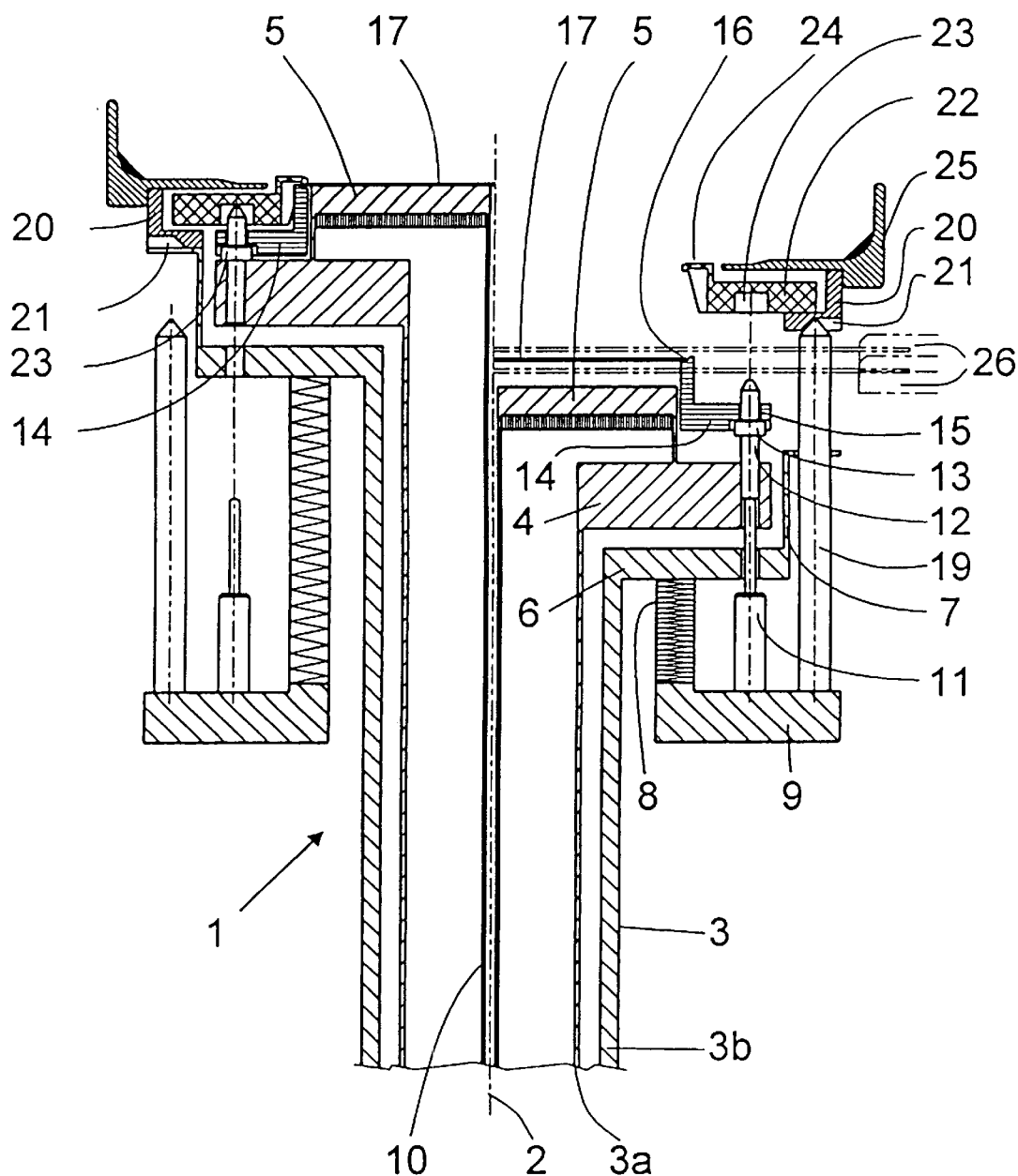

In the lower end position of the holding device, shown on the right in FIG. 2, the workpiece 17 can be placed centred relative to the support plate 5 on the supports 16 of the support ring 14 by means of a robot loader 26. The accuracy of positioning is, for example, ±0.13 mm. The workpiece 17 is then centred with corresponding accuracy relative to the support plate 5. After retraction of the robot loader 26, the lifting movement of the lifting table 1 can begin. First, the support plate 5 touches the underside of the workpiece 17 and lifts it from the supports 16 of the support ring 14. Thereafter, the baseplate 4 reaches the stop formed by the undersides of the support rings 13, and the centring pins 12 are carried along during the further lifting movement. Since, in its rest position, the support ring 14 is supported on the stop rings 13, it is also lifted from the beginning. The stop between the baseplate and the stop rings can also be adjusted so that the support ring is already carried along when the support plate has reached the workpiece or has approached the latter up to an envisaged minimum distance.

In the course of the further lifting movement, the centring pins 12 enter the grooves 23 in the underside of the clamping ring 22 and do so until their upper end regions have been received therein azimuthally virtually without play but so as to be radially movable. Thus, the clamping ring 22, too, is centred with respect to the support plate 5. Shortly before their tips each reach the base of the corresponding groove 23, the surface of the workpiece 17 comes up against the edge of the inner flange 24 of the clamping ring 22, so that the latter is raised from its rest position and, resting on the workpiece 17, fixes the latter in its position relative to the supports 16 and the support plate 5. Shortly afterwards, the driver collar 7 reaches the underside of the intermediate ring 20, whereupon this too is carried along during the further lifting movement. Friction processes during introduction of the workpiece 17 occur virtually only underneath said workpiece, so that the danger of soiling by particles is very greatly reduced.

In the upper end position (FIG. 2, left) of the holding device, the workpiece 17 has now reached its processing position in which its surface can be covered with a layer of, for example, aluminium or silica by, for example, sputtering or can be etched or otherwise treated. Its underside can be heated or cooled by means of the support plate 5, gas being introduced through the pipe 10 and producing a gas cushion between the support plate 5 and the underside of the workpiece 17, which gas cushion ensures uniform heat transmission.

The lifting table 1 with the support plate 5, the support ring 14 with the supports 16, the clamping ring 22 and the intermediate ring 20 with the support profile 25 are preferably all produced from electrically conducting material, in particular metal. The centring pins 12 on the other hand, by means of which these parts are kept a distance apart from one another consist, like the guide bushes (not shown) in the baseplate 4, preferably of insulating, in particular ceramic material, so that the above-mentioned parts are all electrically isolated from one another and can be kept at different potentials. This can be used in various processing operations for controlling the electric field in the process chamber. Moreover, ceramic material has a low coefficient of sliding friction, so that its use for guide bushes or centring pins or both moreover has the advantage that they make little contribution to particle formation. Its low coefficient of thermal expansion furthermore ensures substantial dimensional stability also when the device is under thermal load. Owing to the substantially rotationally symmetric design of the holding device and the coaxial conductor structure, the danger of uncontrolled discharge of currents, for example in RF bias applications, and of interfering fields on measuring and control units is greatly reduced.

After the processing operation, the holding device is brought back to the lower end position. The workpiece 17 is once again in the transfer position and can be picked up by the robot loader 26 and withdrawn.

The holding device has only one drive axis since all movements are effected by raising and lowering the lifting table 1 alone. It is thus very simple mechanically and in terms of control technology and requires little maintenance. Short loading times are achievable, which increases throughput. Many parts are simply placed one on top of the other and not further fixed, so that they can be easily and rapidly changed if required. These properties of the holding device also have an advantageous effect on the availability of the vacuum unit.

Since large temperature differences often occur during the processing operations, it is of considerable importance that, in the device according to the invention, the mutual centring of the support plate 5, of the support ring 14 and of the clamping ring 22 is retained even in the case of different thermal expansions of these parts. This is achieved if the centring pins 12 each have sufficient play radially relative to the support ring 14 and the clamping ring 22 but engage all stated parts azimuthally essentially without play. In the case of a thermal expansion of the baseplate 4, which, owing to the sufficient lateral play of the supports 11, is not hindered by said supports, the centring pins 12 are radially offset, which however, owing to the radial extension of the grooves and of the slots 15 in the support ring 14 and of the grooves 23 in the clamping ring 22, does not lead to difficulties there, similarly to thermal expansions of said rings. The contact points between one of the rings and the centring pins 12 are displaced by different thermal expansions on the ring, while the position of its centre does not change. In a manner which is basically similar to the support ring 14 and the clamping ring 22 with respect to the axis 2, the intermediate ring 20 with the protective profile 25 is centred with respect to a fixed axis which coincides with the axis 2.

In principle, the support plate, the support ring and the clamping ring could also be centred by only two centring elements in a manner not impaired by different thermal expansions, if the planes determined by said elements and the axis make an angle ≠180° there and said parts are secured to prevent mutual rotation about a vertical axis, for example by forming one of the centring elements as a radially oriented plate, but three centring elements, as described, simultaneously offer a support for the support ring 14, which support accurately determines the position of said support ring. It is therefore advantageous to provide at least three centring elements which as far as possible are also equal distances from the axis, although the latter is not absolutely necessary. Preferably, their positions form a regular polygon, in particular triangle, in the centre of which the axis is present. It would also be possible, according to the same principle, to centre said concentric parts in pairs, for example the support ring relative to the support plate and the clamping ring relative to the support ring, but this would not lead to such a compact, robust and simple design.

What is claimed is:

1. A holding device for transporting a disc-shaped workpiece in a vacuum unit, the workpiece being transferable between a lower end position, in which the workpiece is inserted or removed, and an upper end position, in which the workpiece is processed, the holding device comprising:
    a raisable and lowerable lifting table having a support plate corresponding essentially to the shape of the workpiece and being at least approximately rotationally symmetrical about a vertical axis;
    a support ring for holding the workpiece in the lower end position;
    a vertically displaceable clamping ring arranged above the support plate for retaining the workpiece in the upper end position;
    a centring device for centering the support ring and the clamping ring concentrically relative to the vertical axis of the support plate, the centring device engaging the support ring, clamping ring and support plate at least in the upper end position; and
    at least two centring elements of the centring device spaced a distance away from the vertical axis, the at least two centring elements not being aligned all together with the vertical axis in a plane, and being essentially without play azimuthally relative to the support ring, clamping ring and support plate, and engaging at least the support ring and clamping ring in a radially displaceable manner, with at least the clamping ring further being axially displaceable, wherein the support ring, clamping ring and support plate are secured to prevent mutual rotation about the vertical axis.

2. The holding device according to claim 1, wherein the at least two centring elements are at least three centring pins arranged surrounding the vertical axis and each being radially and nondisplaceably anchored in one of the support plate, support ring and clamping ring, while, in at least the upper end position, the at least three centring pins are engaged in radial slots or grooves of the other two of the support plate, support ring and clamping ring.

3. The holding device according to claim 2, wherein the at least three centring pins are oriented parallel to the vertical axis and equidistant from the same.

4. The holding device according to claim 2, wherein the support ring is vertically displaceable and cooperates with the lifting table so that the support ring is carried along by lifting movement of the lifting table after beginning the lifting movement.

5. The holding device according to claim 4, wherein the at least three centring pins are supported in a fixed location in the lower end position, and guided in the lifting table in an axially displaceable manner, but otherwise essentially without play, and are passed through the support ring at least in an axially and radially displaceable manner, and movement of the at least three centring pins upwardly and downwardly with respect to the lifting table is limited in each direction by a stop.

6. The holding device according to claim 5, wherein the support ring has radial slots for receiving the centring pins essentially without play at least azimuthally.

7. The holding device according to claim 5, wherein the stops are each formed by the top or underside of a stop ring surrounding the centring pin.

8. The holding device according to claim 2, wherein an underside of the clamping ring has radial grooves which, at least in the processing position, are engaged by tips of the centring pins essentially without play azimuthally.

9. The holding device according to claim 2, wherein the centring pins are arranged at the vertices of a regular polygon.

10. The holding device according to claim 2, wherein the centring pins are made of ceramic material.

11. The holding device according to claim 1, wherein the support ring has at least three upwardly-projecting supports for holding the workpiece, which, in at least the upper end position, rest in vertical grooves formed in the edge of the support plate.

12. The holding device according to claim 11, wherein the clamping ring has an inward-pointing inner flange which overlaps the supports and has an inner edge bent downwards.

13. The holding device according to claim 1, wherein the clamping ring, in a rest position from which it is raised by contact with the workpiece during a lifting movement of the lifting table, rests on an intermediate ring supported in a fixed location.

14. The holding device according to claim 13, wherein the intermediate ring is supported in the rest position by vertical pins surrounding the vertical axis and points of the vertical pin engage radial grooves in an underside of said intermediate ring, so that the intermediate ring is concurrently centered relative to the vertical axis.

15. The holding device according to claim 13, wherein the intermediate ring carries a protective profile which at least partly covers the top of the clamping ring.

16. The holding device according to claim 15, wherein in at least the upper end position, the protective profile is spaced apart and electrically isolated from each of the clamping ring, the support ring and the support plate.

17. The holding device according to claim 13, wherein the lifting table has a driver which carries along the intermediate ring during the lifting movement.

18. The holding device according to claim 1, wherein the support plate, the support ring and the clamping ring are each made of electrically conducting material and are arranged spaced apart and electrically isolated in at least the upper end position.

19. A holding device for transporting a workpiece in a vacuum unit, the workpiece being movable between a lower end position, in which the workpiece is inserted or removed, and an upper end position, in which the workpiece is processed, the holding device comprising:

- a support plate mounted in a lifting table, the support plate corresponding essentially to the shape of the workpiece and at least approximately rotationally symmetrical about a vertical axis;
- a support ring for holding the workpiece in the lower end position;
- a vertically displaceable clamping ring arranged above the support plate for retaining the workpiece in the upper end position;
- a centring device for centering the support ring and the clamping ring about the vertical axis of the support plate, the centring device engaging the support ring, clamping ring and support plate at least in the upper end position; and
- at least two centring elements of the centring device radially spaced a distance away from the vertical axis, the at least two centring elements not being present together with the vertical axis in a plane, and being essentially without play azimuthally relative to the support ring, clamping ring and support plate and engaging at least two of the support ring, support plate and clamping ring in a radially displaceable manner, and further engaging at least two of the support ring, support plate and clamping ring in an axially displaceable manner, wherein the support ring, clamping ring and support plate are secured to prevent mutual rotation about the vertical axis.

20. The holding device according to claim 19, wherein the at least two centring elements are at least three centring pins arranged surrounding the vertical axis and each being radially and nondisplaceably anchored in one of the support plate, support ring and clamping ring, while, in at least the upper end position, the at least three centring pins are engaged in radial slots or grooves of the other two of the support plate, support ring and clamping ring.

21. The holding device according to claim 20, wherein the at least three centring pins are oriented parallel to the vertical axis and equidistant from the same.

22. The holding device according to claim 20, wherein the clamping ring, in a rest position from which it is raised by contact with the workpiece during a lifting movement of the lifting table, rests on an intermediate ring supported in a fixed location.

* * * * *